(12) United States Patent
Zhengdi (10) Patent No.: US 6,278,865 B1
(45) Date of Patent: Aug. 21, 2001

(54) RECEIVER AND METHOD FOR MEASURING THE FREQUENCY DIFFERENCE BETWEEN A TURNING FREQUENCY AND A TRANSMISSION FREQUENCY

(75) Inventor: Qin Zhengdi, Oulu (FI)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/284,017

(22) PCT Filed: Nov. 26, 1997

(86) PCT No.: PCT/FI97/00728

§ 371 Date: Apr. 6, 1999

§ 102(e) Date: Apr. 6, 1999

(87) PCT Pub. No.: WO98/24204

PCT Pub. Date: Jun. 4, 1998

(30) Foreign Application Priority Data

Nov. 27, 1996 (FI) ........................................................ 964733
Apr. 16, 1997 (FI) ........................................................ 971617

(51) Int. Cl.[7] .................................................... H04B 1/18
(52) U.S. Cl. .................................. 455/184.1; 455/182.3; 455/67.6
(58) Field of Search ............................... 455/265, 184.1, 455/258, 264, 317, 319, 75, 182.3, 182.1, 182.2, 67.6; 375/344

(56) References Cited

U.S. PATENT DOCUMENTS

| | | | |
|---|---|---|---|
| 4,107,624 | * 8/1978 | Turner | 455/265 |
| 5,251,233 | 10/1993 | Labedz et al. | 375/230 |
| 5,343,498 | 8/1994 | Toy et al. | 375/259 |
| 5,434,889 | * 7/1995 | Baier | 455/255 |
| 5,552,838 | * 9/1996 | Suizu | 455/184.1 |
| 5,694,389 | * 12/1997 | Seki et al. | 370/208 |
| 5,731,741 | * 3/1998 | Yamamoto et al. | 455/184.1 |
| 5,732,339 | * 3/1998 | Auvray et al. | 455/265 |
| 5,828,954 | * 10/1998 | Wang | 455/265 |
| 6,006,078 | * 12/1999 | Yamamoto et al. | 455/265 |

FOREIGN PATENT DOCUMENTS

| | | | |
|---|---|---|---|
| 19516449 | 11/1996 | (DE) | H04B/17/00 |
| 0295226 | 12/1988 | (EP) | H04B/7/26 |
| 0381637 | 8/1990 | (EP) | H04L/25/03 |
| 91/17607 | 11/1991 | (WO) | H04B/3/14 |

* cited by examiner

Primary Examiner—William Trost
Assistant Examiner—Rafael Perez-Gutierrez
(74) Attorney, Agent, or Firm—Pillsbury Winthrop LLP (57) ABSTRACT

A method of measuring the frequency difference between a tuning frequency and a transmission frequency is provided. The method includes generating temporally successive estimated impulse responses and comparing the mutual temporal shift of the impulse responses in relation to one another. Additionally, the method includes generating a phase shift between the impulse responses corresponding to the comparison and forming a frequency difference between the transmission frequency and the tuning frequency corresponding to the phase shift. As the estimated impulse responses are generated in succession at given intervals and as the signal is being sampled at a given sampling frequency, the phase shift is generated corresponding to the highest correlation value. The frequency difference between the transmission frequency and the tuning frequency is formed as the ratio of the product of the phase shift and the tuning frequency to the product of the measurement interval and the sampling frequency.

11 Claims, 2 Drawing Sheets

RECEIVER AND METHOD FOR MEASURING THE FREQUENCY DIFFERENCE BETWEEN A TURNING FREQUENCY AND A TRANSMISSION FREQUENCY

FIELD OF THE INVENTION

The invention relates to a method of measuring the frequency difference in a radio receiver generating for synchronization purposes a tuning frequency corresponding as accurately as possible to a transmission frequency, and in which an estimated impulse response for the channel used by a received signal is generated.

The invention also relates to a method of measuring the frequency difference in a radio receiver generating for synchronization purposes a tuning frequency corresponding as accurately as possible to a transmission frequency, and in which the strength and phase of a received signal is measured in relation to the tuning frequency.

The invention further relates to a receiver, arranged to generate for synchronization purposes a tuning frequency corresponding as accurately as possible to a transmission frequency, and to generate an estimated impulse response for the channel used by a received signal.

The invention also relates to a receiver, arranged to generate for synchronization purposes a tuning frequency corresponding as accurately as possible to a transmission frequency, and to measure signal strength and signal phase.

BACKGROUND ART

A basic requirement for the operation of a radio system is that the connection between a transmitter and receiver is synchronized. In conventional radio technology, a PLL receiver (Phase Lock Loop) is employed to achieve and maintain synchronization. However, this method is not very useful in the CDMA system (Code Division Multiple Access).

In the CDMA method, a narrowband user data signal is multiplied to a relatively broad band by a spreading code having a considerably higher frequency than that of the data signal. The aim is to select spreading codes that are mutually substantially orthogonal, i.e. have minimal mutual correlation. Upon transmission, a broadband signal is multiplied, i.e. modulated, by a continuous carrier having a considerably higher frequency than that of the spreading code. Owing to orthogonal spreading codes, the signals of several users can be transmitted on the same carrier.

In a conventional CDMA receiver, the signal carrier is demodulated by multiplying the signal by the tuning frequency of the local oscillator of the receiver. The tuning frequency is intended to have the same frequency as the carrier employed in transmission. The data signal again is returned in the receiver to the original band by multiplying it again by the same spreading code as at the transmission stage.

However, there is usually frequency difference between the tuning frequency of a local oscillator and the carrier employed in transmission. It can be seen as a phase shift between the receiver and the spreading code employed in transmission. Without corrective measures, this phase shift increases the longer the connection between the transmitter and the receiver lasts. In a fading multi-path environment, the change caused by the difference between the transmission carrier and the receiver tuning frequency in the code phase is called a group shift. In a typical multi-path environment of a radio system this increasing group shift cannot be detected reliably with prior art measurements.

DISCLOSURE OF THE INVENTION

It is the object of the present invention to provide a method for reliably detecting a group shift in a multipath environment.

This is achieved with a method of the kind described in the preamble, characterized by generating at least two temporally successive estimated impulse responses, comparing the mutual temporal shift of said impulse responses in relation to one another, generating a phase shift between the estimated impulse responses on the basis of the comparison, and forming a frequency difference between the transmission frequency and the tuning frequency on the basis of the phase shift.

The method of the invention is also characterized by measuring the phase of a received signal at least two temporally successive times, comparing the measured phases with one another, generating a signal phase shift on the basis of the comparison, and forming a frequency difference between the transmission frequency and the tuning frequency on the basis of the phase shift.

The receiver of the invention is characterized in that the receiver comprises means for generating at least two temporally successive estimated impulse responses, means for comparing the temporal shift of said impulse responses in relation to one another, and for generating a phase shift on the basis of the comparison, and means for forming a frequency difference between the transmission frequency and the tuning frequency on the basis of the phase shift.

The receiver of the invention is further characterized in that the receiver comprises means for measuring the phase of a received signal at least two temporally successive times, means for comparing the phases of the received signal with one another, and for generating a phase shift on the basis of the comparison, and means for forming a frequency difference between the transmission frequency and the tuning frequency on the basis of the phase shift.

Considerable advantages are achieved with the method of the invention. The frequency error between the tuning frequency of the receiver and the carrier frequency employed in transmission can be determined exactly and easily, and the error can be corrected. This makes the connection more reliable than before.

DESCRIPTION OF THE DRAWINGS

In the following the invention will be described in greater detail with reference to examples in accordance with the accompanying drawings, in which.

DESCRIPTION OF THE PREFERRED EMBODIMENTS

The solution of the invention is suited to be used in a radio receiver. The solution of the invention is particularly suitable for the CDMA radio system without, however, being restricted to it.

Let us have a closer look at the inventive method. The invention is based on the idea that when two different frequency sources have the same frequencies, their phases remain unchanged in relation to time. In other words, if the frequencies of two frequency sources are different, their phasing changes as a function of time. The rate of phase change is proportional to the frequency difference. In the inventive method the phase change is measured by comparing estimated impulse responses with one another at different points of time. As is known, the estimated impulse responses are based on a signal that has been detected. This is carried out preferably by forming a correlation between the estimated impulse responses. In another embodiment the group shift is measured by observing directly the signal phase in relation to the tuning frequency at no less than two different points of time. If the phase changes from one point of time to another, the tuning frequency has to be adjusted.

Figure 1:
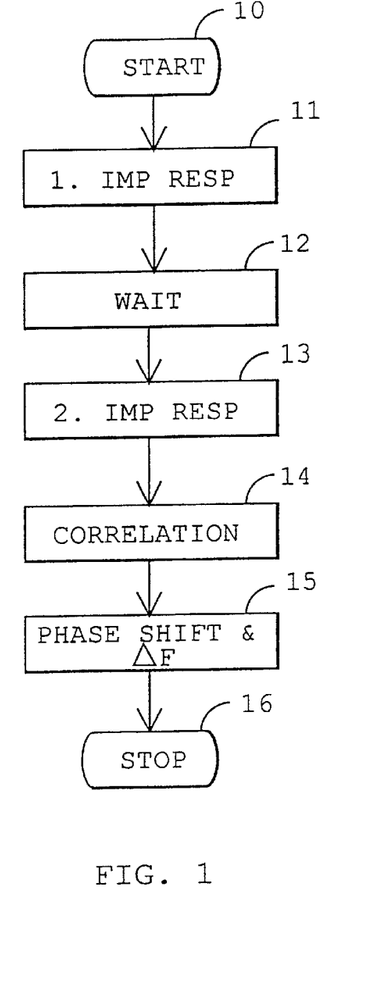
FIG. 1 is a flow diagram of the method of the invention.
Figure 2:
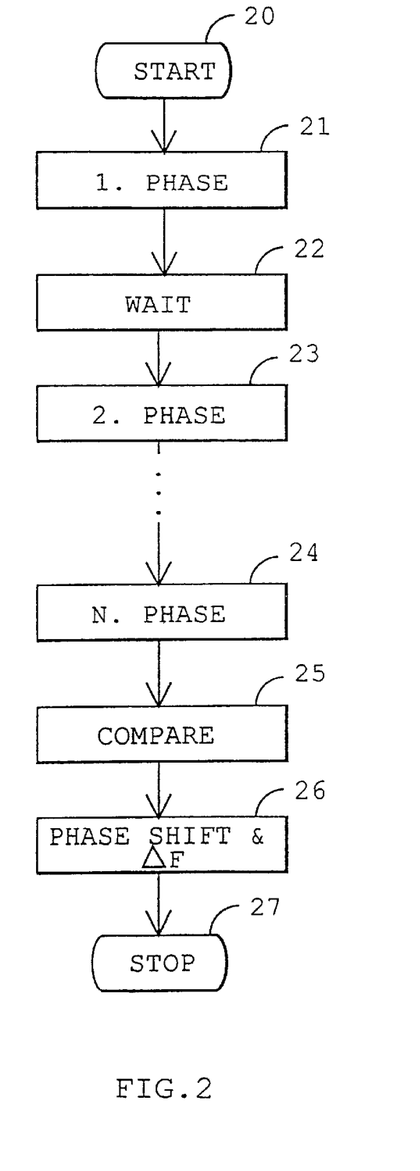
FIG. 2 is a flow diagram of the method of the invention.

Let us now have a closer look at the method of the invention by looking at FIGS. 1 and 2. Processing starts at point 10. At first, a first estimated impulse response is generated at point 11. A predetermined or random measurement interval T is then allowed to pass in block 12, and a second estimated impulse response is generated for the same signal from the same channel or the same channels at point 13. The generated impulse responses are compared with one another by observing their similarity at point 14. The comparison is preferably carried out by calculating the cross correlation or the like. A temporal shift, or phase shift, or group shift, between the impulse responses and a frequency difference to be utilized when correcting the tuning frequency of the local oscillator are generated on the basis of the comparison at point 15. If frequency difference exists, the aim is to eliminate it. Processing ends at point 16.

The estimated impulse response is generated in accordance with prior art in a manner obvious to those skilled in the art. At least two estimated impulse responses are generated in such a way that at least the initiation of the measurements takes place at different points of time. It is vital that the measurement is carried out sufficiently often to prevent the generation of excessive phase deviations between the transmission frequency and the tuning frequency.

FIG. 2 shows another method according to the invention. Processing starts at point 20. At first the phase of a received signal in relation to the tuning frequency is measured at point 21. Then a predetermined or random measurement interval is allowed to pass at point 22 and the phase of the received signal is measured again at point 23. The process continues this way until the last necessary measurement, the measurement of the Nth phase, is carried out at point 24. N can be any integer $N \geq 2$. At point 25 the signal phases are compared with one another and at point 26 the signal phase deviation, or group shift, is generated and then the frequency difference is formed on the basis of the phase deviation. It frequency difference exists, the aim is to remove it. Processing ends at point 27.

In an embodiment of the invention, groups, totaling C, are preferably formed of the phases measured at point 25 to enable signal phase comparison, and in each group the phases are grouped chronologically. Thus, each group comprises M measured phases. C is preferably determined by the formula $$C_N^{N-M} = \frac{N!}{M!(N-M)!},$$

where M is $M<N$, $N!=1\cdot 2\cdot,\ldots,\cdot N$ and C, $M \in \{1, 2, 3, \ldots\}$. Successive phases are then subtracted in pairs from one another to generate phase deviations and the phase deviations are proportioned according to the temporal difference. The measurement is preferably carried out at regular intervals, the proportioning being carried out by dividing the phase deviation, when required, by integers 2, 3, . . . depending on the measurement times to be compared. The phase deviations are used to search for at least one group in which all relative phase deviations are substantially the same, and the frequency difference between the transmission frequency and the tuning frequency is formed on the basis of the phase deviation of the group found. Let a case with 4 measured phase deviations, $X_1$, $X_2$, $X_3$, and $X_4$, when N is $N=4$, serve as an example of this method. In this case four groups $C_4^{4-3}=4$ are formed in the following manner: $X_1$, $X_2$, and $X_3$; $X_1$, $X_2$, and $X_4$; $X_1$, $X_3$, and $X_4$; and $X_2$, $X_3$, and $X_4$. Next phase deviations, proportioned by groups according to measurement times, are formed: $X_2-X_1$ and $X_3-X_2$; $X_2-X_1$ and $(X_4-X_2)/2$; $(X_3-X_1)/2$ and $X_4-X_3$; and $X_3X_2$ and $X_4-X_3$. The generated phase deviations are used further to search for at least one group where the proportioned phase deviations are substantially the same (e.g. $X_2-X_1=X_3-X_2$), and the frequency difference between the transmission frequency and the tuning frequency is formed on the basis of the phase deviation of the group found. Hence all groups formed of phases do not have to be included in the comparison, instead it is preferably sufficient to determine the phase deviation on the basis of the first group fulfilling the conditions. Proportioning, e.g. the subtraction of the phase $X_2$ of the second measurement time from the phase $X_4$ of the fourth measurement time, is needed, since the phase slide between two successive measurement times (e.g. $X_2-X_1$) is smaller by at least half than in some other case (e.g. $X_4-X_2$ or in a general case $X_P-X_Q$, where P-Q>2). In a general case the proportioning is carded out by dividing $(X_i-X_j)$ by the number (i-j), where i and j are phase indices.

The signal phase is preferably measured at the strongest point of the signal in relation to the tuning frequency of the receiver. This is advantageous since at the strongest point of the signal, noise interferes least with the measurement. The phase is preferably measured by calculating the cross correlation between the signal spreading code and the receiver spreading code.

Let us now have a closer look at the mathematical basis of the solution of the invention. Impulse response comparison and signal phase formation are carried out from a received signal as cross correlation or the like. Cross correlation C is calculated in its general format from variables x and y as follows $$C(\tau) = \int_a^b x(\tau) \cdot y(\tau - t) dt, \qquad (1)$$

where a and b represent the correlation calculation interval. There is a correlation between cross correlation C and covariance V $$V_{xy}(t,\tau) = C_{xy}(t,\tau) - \mu_x(t)\mu_y^T(\tau), \qquad (2)$$

where boldface symbols refer to a presentation in the form of a matrix or vector, $\mu_x$ is the mean of variable x, and $\mu_y^T$ is the mean of variable y. This shows that in the solution of the invention, covariance is an operation substantially similar to cross correlation. Correlation C is calculated from digital samples e.g. in accordance with the following formula for variable vectors X and Y $$C(n) = \sum_{i=1}^{N} x(i) \cdot y(n-i), \quad (3)$$

where C(n)=C is given real values within the range C∈[−1, . . . , 1]. Instead of calculating correlation C, covariance $V_{xy}$ or another similar operation measuring similarity or dissimilarity can also be used. Covariance $V_{xy}$ is calculated generally from two vector variables X and Y comprising samples as follows:

$$V_{xy} = \frac{1}{N-1} \sum_{j=1}^{N} (x(j) - \hat{x})(y(j) - \hat{y}), \quad (4)$$

where $\hat{x}$ is the mean of the samples of variable X, $\hat{y}$ is the mean of the samples of variable Y, and N is the total number of samples. When e.g. a RAKE receiver is used, multivariate cross correlation calculation can be employed. The multivariate correlation C of impulse responses X, for example, can be expressed as a formula in a general form as follows $$C(x(1), \ldots, x(k)) = \sum_{i1} \cdots \sum_{ik} x(1) \cdot x(2) \cdots x(k), \quad (5)$$

where measurements of the estimated impulse responses x(i) are needed at several different points of time.

In a radio system employing a carrier, the tuning frequency is generally preferably the frequency of the local oscillator of the receiver, and the transmission frequency is the frequency of the carrier used in transmission. The samples needed in the calculation preferably represent chips of the spreading code, and one or more samples can be taken from one chip.

In order to find the mutual group shift of two impulse responses, the cross correlation of the impulse responses is calculated and a search is made for the highest correlation value representing the group shift and the phase deviation of the code. In searching for the highest value, the values are preferably limited by a predetermined threshold value which the highest value must exceed. This way the interference caused by noise is avoided. The maximum value of the correlation is thus at sample n.

In another embodiment of the invention, in which the phase deviation between the signal carrier frequency and the tuning frequency is measured directly between the signal spreading code and the receiver spreading code as a correlation, the phase deviation can be detected as the phase shift of the correlation peak to a sample n. If the peak of the correlation or the direct measurement result of the phase shift is at point n=0, this indicates that the tuning frequency of the receiver and the transmission carrier frequency are identical. If again the maximum value of the correlation is at n=m, the frequency difference Δf can be calculated as follows:

$$\Delta f = \frac{m}{T} \cdot \frac{f_{rc}}{f_s}, \quad (6)$$

where $f_{rc}$ is the frequency of the receiver carrier, i.e. the tuning frequency, $f_s$ is the sampling frequency and T is the interval between measurements. Let us assume by way of simulation that the tuning frequency which is close to the carrier frequency is for example $f_{rc}$=1.8 GHz, $f_s$=25 MHz and T=500 ms. In this case the temporal shift corresponding to one chip (m=1) represents a 144-Hz frequency difference between the receiver tuning frequency and the transmission carrier. Thus the frequency difference is inversely proportional to the measurement interval T. In a stable environment, the synchronization of the tuning frequency can be improved by increasing the measurement interval T. If again the environmental properties undergo rapid changes, the interval T has to be kept sufficiently short to obtain reliable results. In principle the correlation function C is cyclical as is the spreading code. Hence the maximum possible observable phase group shift is $$m = \pm \frac{N}{2},$$

when the cycle length of the spreading code is N. This limitation can, however, be bypassed, and the shift can be extended to the following spreading code cycles. On the other hand, in a typical situation the spreading code is much longer than the phase group shift and hence $$m < \pm \frac{N}{2}.$$

Figure 3:
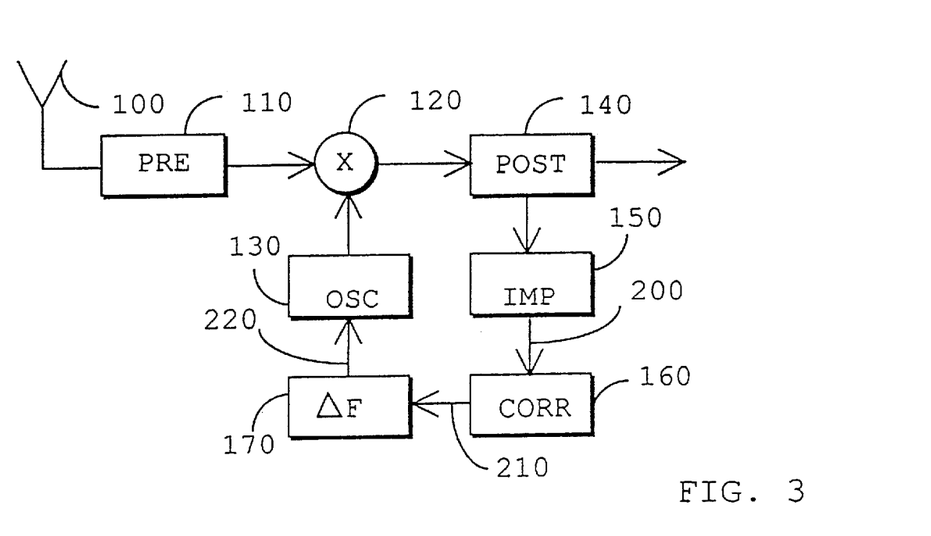
FIG. 3 shows a receiver according to the invention.

FIG. 3 shows a block diagram of the inventive receiver operating in accordance with the inventive method. The receiver comprises an antenna 100, preprocessing means 110, a mixer 120, a local oscillator 130, post processing means 140, means 150 for generating an impulse response, means 160 for comparing the mutual shift of the impulse responses and for generating a phase shift, and means 170 for forming a frequency difference for controlling the local oscillator 130. A signal received by the antenna 100 first propagates to the preprocessing means 110 comprising e.g. a filter. The signal then propagates to the mixer 120 where is it multiplied by the frequency of the local oscillator 130. In the post processing means 140 the signal is filtered and e.g. in. the CDMA system the signal is converted by an A/D converter into digital form. From the post processing means 140 the signal propagates to other radio system processes. In addition, the signal, preferably converted into digital form, propagates to the means 150 and an estimated impulse response is generated of the signal at two different points of time. These impulse responses 200 are compared with one another in the means 160 which are preferably a correlator. On the basis of the comparison, the means 160 generate a phase deviation 210 for the impulse responses and the means 170 form a frequency difference 220 between the tuning frequency of the local oscillator and the carrier of the transmitted signal of the phase deviation 210.

Figure 4:
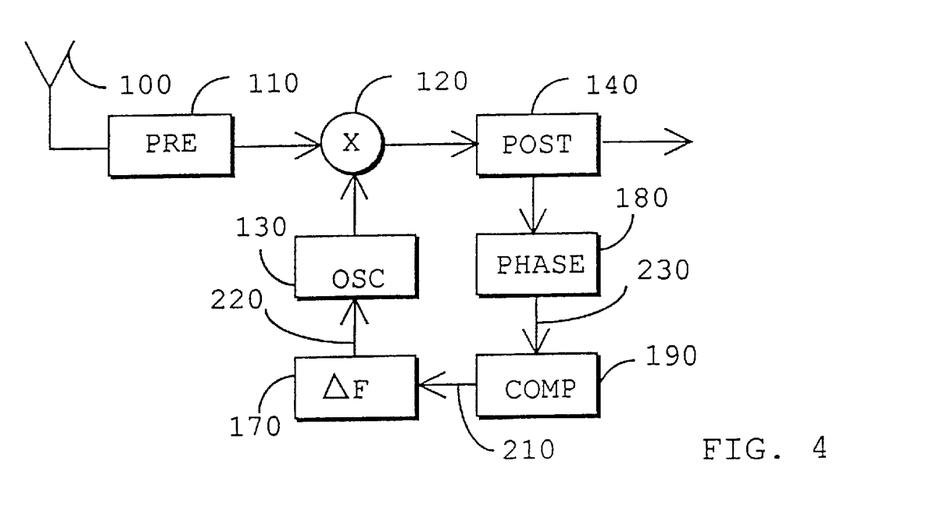
FIG. 4 shows a receiver according to the invention.

FIG. 4 shows a block diagram of the inventive receiver operating in accordance with the inventive method. The receiver comprises an antenna 100, preprocessing means 110, a mixer 120, a local oscillator 130, post processing means 140, means 180 for measuring signal phase, means 190 for comparing the phases and for generating a phase shift and means 170 for forming a frequency difference for controlling the local oscillator 130. A signal received by the antenna 100 first propagates to the preprocessing means 110 comprising e.g. a filter. The signal then propagates to the mixer 120 where it is multiplied by the frequency of the local oscillator 130. In the post processing means 140 the signal is filtered and e.g. in the CDMA system the signal is converted by an A/D converter into digital form. From the post processing means 140 the signal propagates to other radio system processes. From the post processing means 140 the signal, preferably converted into digital form, propagates to the means 180 in which the signal phase is determined at no less than two different points of time. Phase data 230 propagate to the means 190 which compare the phases and generate a phase shift 210. The means 170 utilize the phase shift to form a frequency difference 220 which is used to control the frequency of the local oscillator 130.

The solution of the invention is particularly suited to a subscriber terminal in a radio system, since it has to synchronize to a frequency given from the base station. The solutions of the invention can be implemented by e.g. ASIC or VLSI circuits (Application-Specific Integrated Circuit, Very Large Scale Integration), particularly as far as digital signal processing is concerned. The functions to be performed are preferably implemented by software based on microprocessor technique.

Although the invention has been described above with reference to examples according to the accompanying drawings, it is obvious that the invention is not limited to them but can be modified in various ways within the scope of the inventive idea disclosed in the attached claims.

What is claimed is:

1. A method of measuring the frequency difference in a radio receiver generating for synchronization purposes a tuning frequency corresponding to a transmission frequency, and in which the strength and phase of a received signal is measured in relation to the tuning frequency, said method comprising:

measuring the phase of a received signal at least two temporally successive times, comparing the measured phases with one another, generating a signal phase shift on the basis of the comparison, and forming a frequency difference between the transmission frequency and the tuning frequency on the basis of the phase shift, wherein the phase of the received signal is measured temporally N (N≧2) successive times and C groups are formed of the phases measured, each group comprising M measured phases, where C is determined by the formula $$C_N^{N-M} = \frac{N!}{M!(N-M)!},$$

M is M<N and C, M and N $\epsilon\{1, 2, 3, \ldots\}$, the phases are grouped chronologically, successive phases are subtracted from one another to form phase deviations and the phase deviations are proportioned according to the temporal difference, a search is made for at least one group in which all relative phase deviations are substantially the same, and the frequency difference between the transmission frequency and the tuning frequency is formed on the basis of the phase deviation of the group found, wherein 4 phase deviations, $X_1$, $X_2$, $X_3$, and $X_4$, are measured when N is N=4, four groups $C_4^{4-3}=4$ are formed in the following manner:

$X_1$, $X_2$, and $X_3$,
$X_1$, $X_2$, and $X_4$,
$X_1$, $X_3$, and $X_4$, and
$X_2$, $X_3$, and $X_4$, temporally proportioned phase deviations are generated:

phase differences $X_2-X_1$ and $X_3-X_2$,
phase differences $X_2-X_1$ and $(X_4-X_2)/2$,
phase differences $(X_3-X_1)/2$ and $X_4-X_3$, and
phase differences $X_3-X_2$ and $X_4-X_3$, a search is made for at least one group where the proportioned phase deviations are substantially the same, and the frequency difference between the transmission frequency and the tuning frequency is formed on the basis of the phase deviation of the group found.

2. A receiver, arranged to generate for synchronization purposes a tuning frequency corresponding to a transmission frequency, and to measure signal strength and signal phase, the receiver comprising:

means for measuring the phase of a received signal at least two temporally successive times, means for comparing the phases of the received signal with one another, and for generating a phase shift on the basis of the comparison, and means for forming a frequency difference between the transmission frequency and the tuning frequency on the basis of the phase shift, wherein the means for measuring are arranged to measure the phase of the received signal N (N≧2) successive times, and the means for comparing are arranged to for C groups of the phases measured, each group comprising M phases, where C is determined by the formula $$C_N^{N-M} = \frac{N!}{M!(N-M)!},$$

M is M<N, and C, M and N $\epsilon\{1, 2, 3, \ldots\}$, to group the phases chronologically, to subtract successive phases from one another to form phase deviations and to proportion the phase deviations according to the temporal difference, and to search for at least one group in which all relative phase deviations are substantially the same, and the means for forming are arranged to form the frequency difference between the transmission frequency and the tuning frequency on the basis of the phase deviation of the group found, wherein the means for measuring are arranged to measure 4 phase deviations, $X_1$, $X_2$, $X_3$, and $X_4$, when N is N=4 and to form four groups $C_4^{4-3}=4$ in the following manner:

$X_1$, $X_2$, and $X_3$,
$X_1$, $X_2$, and $X_4$,
$X_1$, $X_3$, and $X_4$, and
$X_2$, $X_3$, and $X_4$, the means for comparing are arranged to generate temporally proportioned grouped phase deviations:

phase differences $X_2-X_1$ and $X_3-X_2$,
phase differences $X_2-X_1$ and $(X_4-X_2)/2$,
phase differences $(X_3-X_1)/2$ and $X_4-X_3$, and
phase differences $X_3-X_2$ and $X_4-X_3$, the means for comparing are arranged to search for at least one group where the proportioned phase deviations are substantially the same, and the means are arranged to form the frequency difference between the transmission frequency and the tuning frequency on the basis of the phase deviation of the group found.

3. A method of measuring the frequency difference in a radio receiver generating for synchronization purposes a tuning frequency corresponding to a transmission frequency, and in which the strength and phase of a received signal is measured in relation to the tuning frequency, said method comprising:

measuring the phase of a received signal at least two temporally successive times, comparing the measured phases with one another, generating a signal phase shift on the basis of the comparison, and forming a frequency difference between the transmission frequency and the tuning frequency on the basis of the phase shift, wherein the phase of the received signal is measured temporally N (N≧2) successive times and C groups are formed of the phases measured, each group comprising M measured phases, where C is determined by the formula $$C_N^{N-M} = \frac{N!}{M!(N-M)!},$$

M is M<N, and C, M and N $\in\{1, 2, 3, \ldots\}$, the phases are grouped chronologically, successive phases are subtracted from one another to form phase deviations and the phase deviations are proportioned according to the temporal difference, a search is made for at least one group in which all relative phase deviations are substantially the same, and the frequency difference between the transmission frequency and the tuning frequency is formed on the basis of the phase deviation of the group found.

4. A receiver, arranged to generate for synchronization purposes a tuning frequency corresponding to a transmission frequency, and to measure signal strength and signal phase, the receiver comprising:

means for measuring the phase of a received signal at least two temporally successive times, means for comparing the phases of the received signal with one another, and for generating a phase shift on the basis of the comparison, and means for forming a frequency difference between the transmission frequency and the tuning frequency on the basis of the phase shift, wherein the means for measuring are arranged to measure the phase of the received signal N (N≧2) successive times, and the means for comparing are arranged to form C groups of the phases measured, each group comprising M phases, where C is determined by the formula $$C_N^{N-M} = \frac{N!}{M!(N-M)!},$$

M is M<N, and C, M and N $\in\{1, 2, 3, \ldots\}$, to group the phases chronologically, to subtract successive phases from one another to form phase deviations and to proportion the phase deviations according to the temporal difference, and to search for at least one group in which all relative phase deviations are substantially the same, and the means for forming are arranged to form the frequency difference between the transmission frequency and the tuning frequency on the basis of the phase deviation of the group found.

5. A method of measuring the frequency difference in a radio receiver generating for synchronization purposes a tuning frequency corresponding to a transmission frequency, and in which an estimated impulse response for the channel used by a received signal is generated, the method comprising:

generating at least two temporally successive estimated impulse responses, comparing the mutual temporal shift of said impulse responses in relation to one another, generating a phase shift between the estimated impulse responses on the basis of the comparison, and forming a frequency difference between the transmission frequency and the tuning frequency on the basis of the phase shift, wherein the comparison of the mutual temporal shift of the estimated impulse responses is carried out by calculating the correlation between the impulse responses, and wherein as the estimated impulse responses are generated in succession at given intervals and as the signal is being sampled at a given sampling frequency, the phase shift is generated on the basis of the highest correlation value, the frequency difference between the transmission frequency and the tuning frequency being formed as the ratio of the product of the phase shift and the tuning frequency to the product of the measurement interval and the sampling frequency.

6. A receiver, arranged to generate for synchronization purposes a tuning frequency corresponding to a transmission frequency, and to generate an estimated impulse response for the channel used by a received signal, the receiver comprising:

means for generating at least two temporally successive estimated impulse responses, means for comparing the temporal shift of said impulse responses in relation to one another, and for generating a phase shift on the basis of the comparison, and means for forming a frequency difference between the transmission frequency and the tuning frequency on the basis of the phase shift, wherein the means for comparing are arranged to form the correlation between the estimated impulse responses, wherein when the means for generating are arranged to generate the estimated impulse responses in succession at given measurement intervals and to sample the signal at a given sampling frequency, the means for comparing are arranged to form a phase shift, based on the highest correlation value, and the means for forming are arranged to form the frequency difference as the ratio of the product of the phase shift and the tuning frequency to the product of the measurement interval and the sampling frequency.

7. A method of measuring the frequency difference in a radio receiver generating for synchronization purposes a tuning frequency corresponding to a transmission frequency, and in which an estimated impulse response for the channel used by a received signal is generated, the method comprising:

generating at least two temporally successive estimated impulse responses, comparing the mutual temporal shift of said impulse responses in relation to one another, generating a phase shift between the estimated impulse responses on the basis of the comparison, and forming a frequency difference between the transmission frequency and the tuning frequency on the basis of the phase shift, wherein the comparison of the mutual temporal shift of the estimated impulse responses is carried out by calculating the correlation between the impulse responses, and wherein when measuring the frequency differences of several signals, a multivariate correlation is generated between all the signals whose frequency difference in relation to the tuning frequency is to be measured simultaneously.

8. A receiver, arranged to generate for synchronization purposes a tuning frequency corresponding to a transmission frequency, and to generate an estimated impulse response for the channel used by a received signal, the receiver comprising:

means for generating at least two temporally successive estimated impulse responses,     means for comparing the temporal shift of said impulse responses in relation to one another, and for generating a phase shift on the basis of the comparison, and     means for forming a frequency difference between the transmission frequency and the tuning frequency on the basis of the phase shift,     wherein the means for comparing are arranged to form the correlation between the estimated impulse responses,     wherein when more than one signal is concerned, the means for comparing are arranged to form a multivariate correlation between all the signals whose frequency difference in relation to the tuning frequency is to be measured simultaneously.

9. A method of measuring the frequency difference in a radio receiver generating for synchronization purposes a tuning frequency corresponding to a transmission frequency, and in which the strength and phase of a received signal is measured in relation to the tuning frequency, said method comprising:

measuring the phase of a received signal at least two temporally successive times,     comparing the measured phases with one another,     generating a signal phase shift on the basis of the comparison, and forming a frequency difference between the transmission frequency and the tuning frequency on the basis of the phase shift,     wherein when sampling a signal at a given sampling frequency, the frequency difference between the transmission frequency and the tuning frequency is formed as the ratio of the product of the phase shift and the tuning frequency to the product of the measurement interval and the sampling frequency.

10. A receiver, arranged to generate for synchronization purposes a tuning frequency corresponding to a transmission frequency, and to measure signal strength and signal phase, the receiver comprising:

means for measuring the phase of a received signal at least two temporally successive times,     means for comparing the phases of the received signal with one another, and for generating a phase shift on the basis of the comparison, and     means for forming a frequency difference between the transmission frequency and the tuning frequency on the basis of the phase shift,     wherein when the receiver is arranged to sample the signal at a given sampling frequency, the means for forming are arranged toonrm the frequency difference between the transmission frequency and the tuning frequency as the ratio of the product of the phase shift and the tuning frequency to the product of the measurement interval and the sampling frequency.

11. A receiver, arranged to generate for synchronization purposes a tuning frequency corresponding to a transmission frequency, and to measure signal strength and signal phase, the receiver comprising:

means for measuring the phase of a received signal at least two temporally successive times,     means for comparing the phases of the received signal with one another, and for generating a phase shift on the basis of the comparison, and     means for forming a frequency difference between the transmission frequency and the tuning frequency on the basis of the phase shift,     wherein as the receiver is sampling the signal at a given sampling frequency, the frequency difference between the transmission frequency and the tuning frequency is formed as the ratio of the product of the phase shift and the tuning frequency to the product of the measurement interval and the sampling frequency.

\* \* \* \* \*

UNITED STATES PATENT AND TRADEMARK OFFICE
CERTIFICATE OF CORRECTION

PATENT NO. : 6,278,865 B1                Page 1 of 1
DATED : August 21, 2001
INVENTOR(S) : Zhengdi It is certified that error appears in the above-identified patent and that said Letters Patent is hereby corrected as shown below:

Title page,
Please correct to read as follows:
-- [54] RECEIVER AND METHOD FOR MEASURING THE FREQUENCY DIFFERENCE BETWEEN A TUNING FREQUENCY AND A TRANSMISSION FREQUENCY --

Signed and Sealed this

Ninth Day of April, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.     : 6,278,865 B1
DATED          : August 21, 2001
INVENTOR(S)    : Zhengdi It is certified that error appears in the above-identified patent and that said Letters Patent is hereby corrected as shown below:

<u>Title page, Item [54] and Column 1, lines 1-5,</u>
Please correct to read as follows:
-- [54]  RECEIVER AND METHOD FOR MEASURING THE FREQUENCY DIFFERENCE BETWEEN A TUNING FREQUENCY AND A TRANSMISSION FREQUENCY --

Signed and Sealed this

Twentieth Day of May, 2003

JAMES E. ROGAN
*Director of the United States Patent and Trademark Office*